United States Patent
Park et al.

[11] Patent Number: 5,929,654
[45] Date of Patent: Jul. 27, 1999

[54] TEMPERATURE-INSENSITIVE CURRENT CONTROLLED CMOS OUTPUT DRIVER

[75] Inventors: Hong-June Park, Kyoungsangbuk-Do; Cheol-Hee Lee, Choongchungbuk-Do, both of Rep. of Korea

[73] Assignee: Postech Foundation, Kyoungsangbuk-do, Rep. of Korea

[21] Appl. No.: 08/891,153

[22] Filed: Jul. 10, 1997

[30] Foreign Application Priority Data

Jul. 10, 1996 [KR] Rep. of Korea .................. 96-27730

[51] Int. Cl.⁶ .................. H03K 19/00; H03K 17/16; H03K 19/094
[52] U.S. Cl. .................. 326/58; 326/32; 326/27; 326/83
[58] Field of Search .................. 326/58, 57, 27, 326/26, 83, 31, 32, 34, 86, 121

[56] References Cited

U.S. PATENT DOCUMENTS

| | | | |
|---|---|---|---|
| 4,334,186 | 6/1982 | Sasayama et al. | 323/365 |
| 4,833,350 | 5/1989 | Frisch | 326/64 |
| 5,051,625 | 9/1991 | Ikeda et al. | 326/27 |
| 5,631,600 | 5/1997 | Akioka et al. | 327/513 |
| 5,682,110 | 10/1997 | Rountree | 326/58 |
| 5,798,637 | 8/1998 | Kim et al. | 323/313 |

*Primary Examiner*—Michael Tokar
*Assistant Examiner*—Daniel D. Chang
*Attorney, Agent, or Firm*—Pennie & Edmonds LLP

[57] ABSTRACT

A circuit for selectively generating one of three voltage level as an output has a pull-up transistor and a pull-down transistor. The circuit includes a bias voltage source for generating a constant voltage signal; a temperature compensating constant-current source for outputting variable voltage signal corresponding to a temperature change; a tri-state control circuit for receiving a data signal to generate a control signal based on the data signal; and a switching circuit, in response to the control signal, for selectively the bias voltage source and the temperature compensating constant current source to the pull-up and pull-down transistors.

4 Claims, 5 Drawing Sheets

TEMPERATURE-INSENSITIVE CURRENT CONTROLLED CMOS OUTPUT DRIVER

FIELD OF THE INVENTION

The present invention is directed to a CMOS (complementary metal oxide semiconductor)-employing output driver; and, more particularly, to a temperature-insensitive current controlled CMOS output driver which is capable of effectively eliminating the need for overdesign of the driver transistor size to meet the delay specification at high temperature.

DESCRIPTION OF THE PRIOR ART

In general, most of conventional digital logic circuits have outputs having two voltage levels, and recently, computers with a bus structure have brought about a development of a logic circuit, e.g., a tri-state logic (TSL), having three output states, an apparatus including a third output state being called a high impedance or a high-Z state in addition to general high and low voltage levels.

FIG. 1 illustrates a conventional CMOS output driver having three output states, wherein the conventional CMOS output driver includes an inverter I1 for inverting a control signal C; an inverter I2 for inverting a data signal D; a NOR gate N1 for NORing outputs from the inverters I1 and I2; a NAND gate N2 for NANDing the control signal C and an output from the inverter I2; inverters I3 and I4 for respectively inverting outputs from the gates N1 and N2; an output pull-up PMOS (P channel MOS) transistor M1 connected to the inverter I3; and an output pull-down NMOS (N channel MOS) transistor M2 connected to the inverter I4. The pull-up and pull-down transistors M1 and M2 are connected to an I/O (input/output) pin 1 through drain nodes of the transistors M1 and M2, the I/O pin being provided with a load capacitor CL as a driver output.

In the output driver, when a control signal C is at a low voltage level, regardless of the voltage level of the data signal D, an output of the NOR gate N1 will be at a low voltage level and an output of a NAND gate N2 becomes a high voltage level, and outputs of the inverters I3 and I4 at high and low voltage levels, respectively. Thus, each of the pull-up transistor M1 and the pull-down transistor M2 will be in a turn-off state, thereby allowing an output of the I/O pin 1 to be in a high-impedance state. However, when the control signal C is a high voltage level and the data signal D is at a low voltage level, voltage levels of all of the outputs of the NOR and NAND gates N1 and N2 become high. This sets the pull-up transistor M1 in a turn-off state and the pull-down transistor M2 in a turn-on state, and then charge in a capacitor CL of the I/O pin 1 becomes discharged through the pull-down transistor M2. As a result, the voltage level of the driver output becomes a low voltage level. On the other hand, when both of the voltage levels of the control signal C and the data signal D are high, voltage levels of all of the outputs of the NOR and NAND gates N1 and N2 become high and those of respective outputs of the inverters I3 and I4 become low. As a result, only the pull-up transistor M1 will be in a turn-on state and the capacitor CL will be charged by the drain charge of the pull-up transistor M1 to reach a high voltage level, e.g., the voltage Vcc, and the voltage level of the driver output become high.

In such a conventional circuit, when the pull-down transistor M2 is turned on and the charge prestored in the capacitor CL is discharged through the pull-down transistor M2, there is an inherent problem that a ground bounce noise is introduced due to the voltage drop $$L \frac{di}{dt}$$

across a parasitic inductance L appearing on the source of the transistor M2, wherein the parasitic inductance L appears on bonding wires of a chip, package lead frames and metal stripes on a printed circuit board. This noise temporarily causes an incorrect data output on memory devices or slow down the transient response and increases settling time td, as shown in FIGS. 2 and 3.

Several circuit design techniques have been developed to minimize the ground bounce noise. Referring to FIG. 4, one of those, i.e., a CMOS output driver which is capable of effectively reducing such an effect caused by the parasitic inductance L, is described. The CMOS output driver is also disclosed in U.S. Pat. No. 5,436,577 issued to the same applicant of the present invention.

In the output driver shown in FIG. 4, NMOS transistors M3 and M4 are further provided to the conventional output driver shown in FIG. 1 in order to reduce such an effect caused by the parasitic inductance L. That is, when the inverter output is at a high voltage level and, therefore, the pull-down transistor M2 is turned on to thereby discharge the capacitor CL, the voltage applied to the gate of the pull-down transistor M2 is reduced by a desirable amount through the use of NMOS transistors M3 and M4, wherein the desirable amount is obtained by deducting a threshold voltage Vth of NMOS transistor M4 from the supply voltage Vcc as shown in FIG. 4. Consequently, since the pull-down transistor M2 will be in a turn-on state with the gate voltage having a relatively low voltage level, the discharge current flow through the pull-down transistor M2 will be decreased to a desirable value to thereby reduce the effect caused by the parasitic inductance L.

However, in the output driver shown in FIG. 4, there is another problem: it is difficult to compensate the change of current due to the change in the temperature, as shown in FIG. 5, which also appears in the case of the conventional output driver shown in FIG. 1. Namely, since it is well known that a drain current Id of a MOS transistor is proportional to a carrier mobility $\mu$ and the carrier mobility $\mu$ is proportional to $T^{-1.5}$, T being an absolute temperature, the drain current Id becomes proportioned to the absolute temperature $T^{-1.5}$. As a result, when the temperature increases, the drain current Id decreases.

Accordingly, the pull-up and pull-down transistors are conventionally designed with a channel width wide enough to cover the current varying depend on the temperature within a range of an operational temperature, e.g., 0–70° C. In such a case, the lower the temperature is getting, the larger the current charged to the output I/O pin or the discharged current is getting. Consequently, there is disadvantage that the ground bounce noise is significantly increased depending on the increased drain current.

SUMMARY OF THE INVENTION

It is, therefore, a primary object of the invention to provide a temperature-insensitive current controlled CMOS (complementary metal oxide semiconductor) output driver which is capable of effectively eliminating the ground bounce noise regardless of a change of temperature.

In accordance with an aspect of the present invention, there is provided a circuit for selectively generating one of three voltage level as an output, having a pull-up transistor and a pull-down transistor, the circuit comprising: a bias voltage source for generating a constant voltage signal; a temperature compensating constant-current source for outputting variable voltage signal depending on a temperature change; a tri-state controller for receiving a data signal to generate a control signal based on the data signal; and a switch circuit, in response to the control signal, for selectively providing the bias voltage source and the temperature compensating constant-current source to the pull-up and the pull-down transistors.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Figure 6:
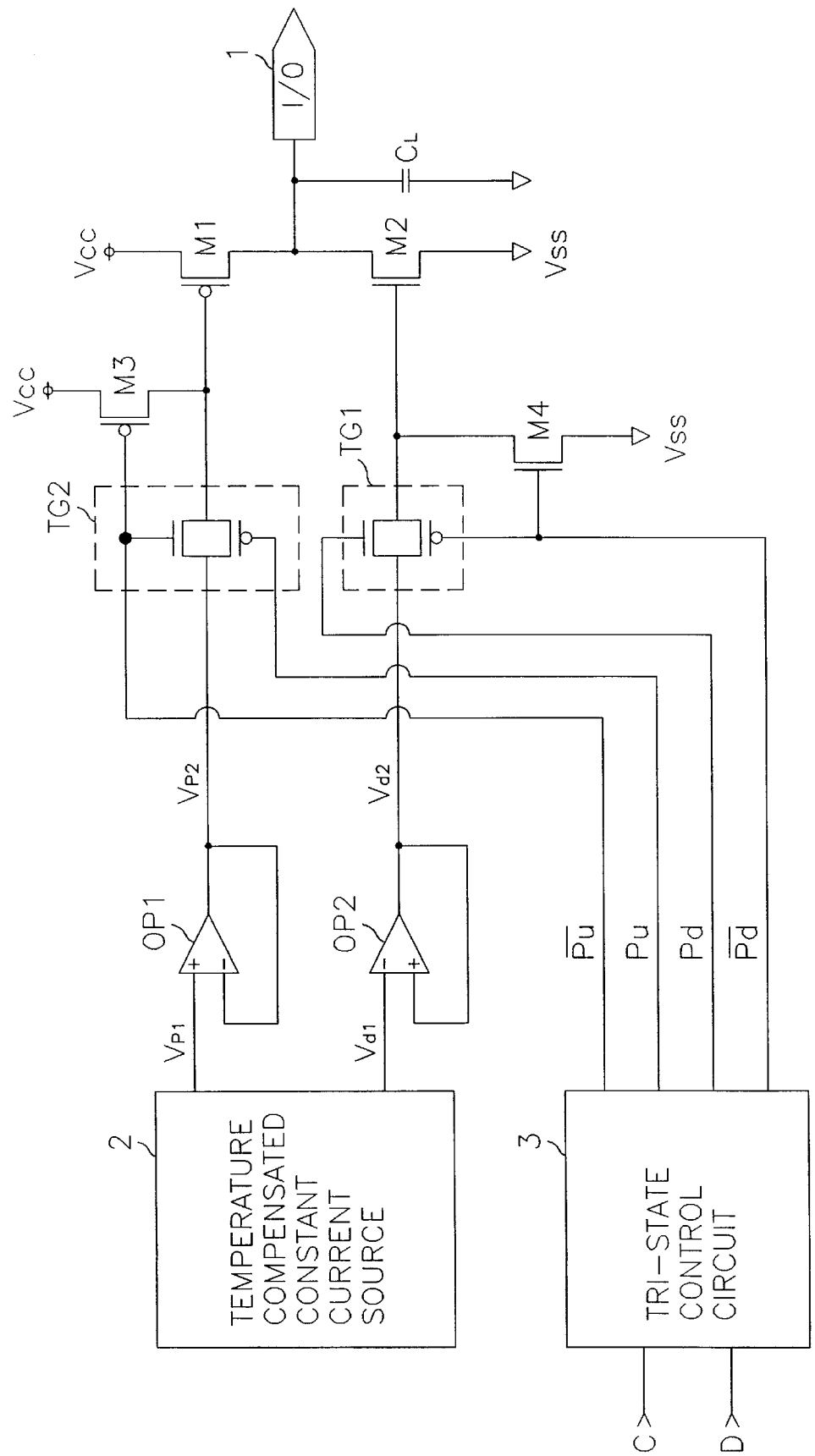
FIG. 6 offers a schematic circuit diagram of the CMOS output driver in accordance with the present invention.

FIG. 6 provides a schematic circuit showing a CMOS (complementary metal oxide semiconductor) output driver, wherein outputs of a temperature compensating constant-current source 2 is connected with each of operational (OP) amplifiers OP1 and OP2, and produces temperature variable voltages Vp1 and Vd1 in order to provide a constant current regardless of the change in temperature. Both of the OP amplifiers OP1 and OP2 serves to operate as unity gain buffers for transmitting the voltages Vp1 and Vd1 to a pull-up and a pull-down transistors M1 and M2, respectively, within a short time, each of the unity gain buffer having 1 as a voltage gain. It is readily appreciated by anyone who is skilled in the art that such OP amplifiers OP1 and OP2 are not necessarily needed for implementing the present output driver, but can be used for speeding the operation in case that there are a number of the pull-up and the pull-down transistors to be driven.

The voltages Vp2 and Vd2 from the OP amplifiers OP1 and OP2 are applied to transmission gates TG2 and TG1, and then the transmission gates TG2 and TG1 respectively apply the voltages Vp2 and Vd2 to the pull-up and pull-down transistors M1 and M2, respectively, in response to control signals Pu and $\overline{Pu}$, Pd and $\overline{Pd}$ from a tri-state control circuit 3. A first control signal $\overline{Pu}$ represents a signal inverted from a second control signal Pu and a third control signal Pd denotes a signal inverted from a fourth control signal $\overline{Pd}$.

The source of a transistor M3 is coupled to the output of the transmission gates TG2 and the gate of a pull-up transistor M1, and the drain of a transistor M4 is connected to the output of the transmission gates TG1. The drain of the transistor M3 is coupled to a bias voltage source Vcc; its source is connected to the gate of a pull-up transistor M1; and its gate is provided with the first control signal $\overline{Pu}$. The source of the transistor M4 is coupled to a ground; its drain is connected to the gate of the pull-down transistor M2; and its gate is provided with the fourth control signal $\overline{Pd}$. As a result, the transistors M3 and M4 control the driving of the pull-up and pull-down transistors M1 and M2 in response to the first and the fourth control signals $\overline{Pu}$ and $\overline{Pd}$, respectively.

Figure 1:
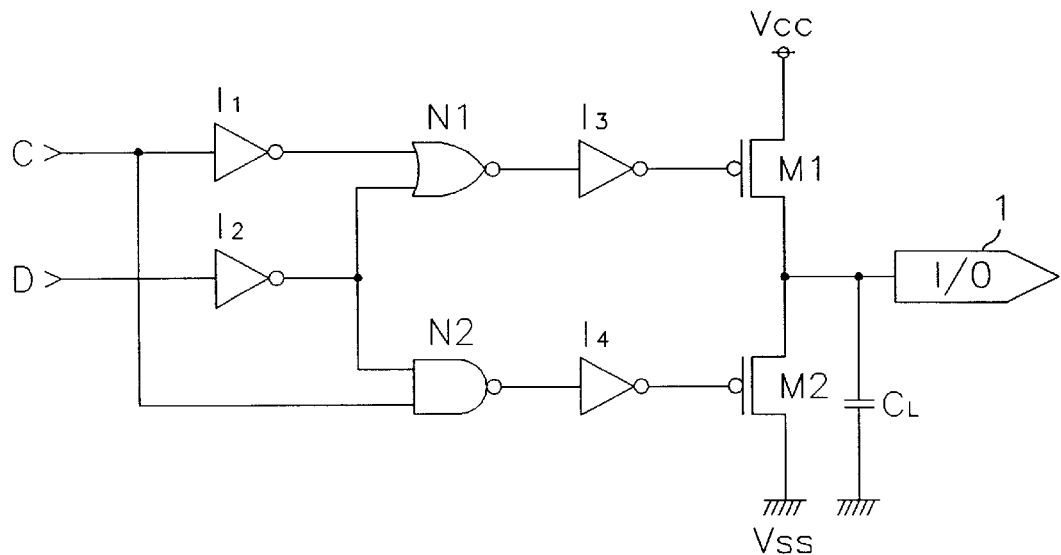
FIG. 1 presents a circuit diagram of a conventional CMOS (complementary metal oxide semiconductor) output driver.
Figure 2:
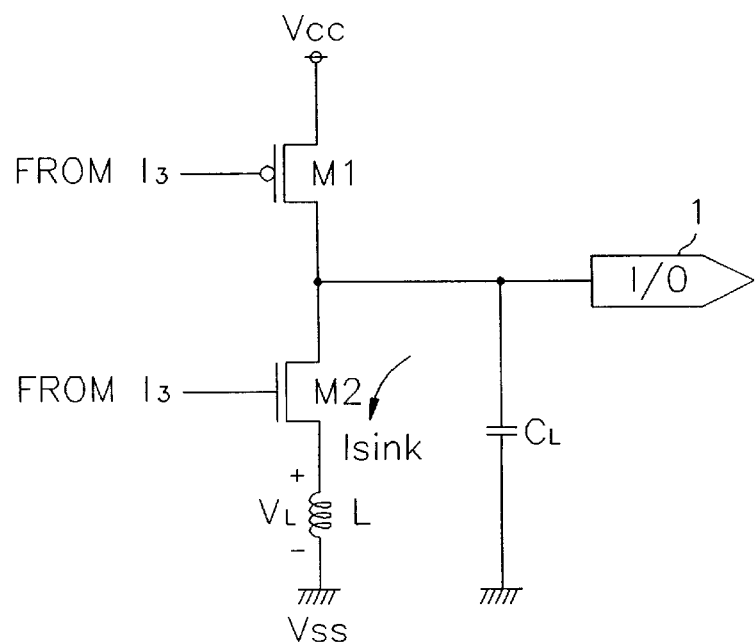
FIG. 2 is a circuit diagram illustrating a relation ship of a parasitic inductance and a load capacitor contained in the circuit shown in FIG. 1.
Figure 3:
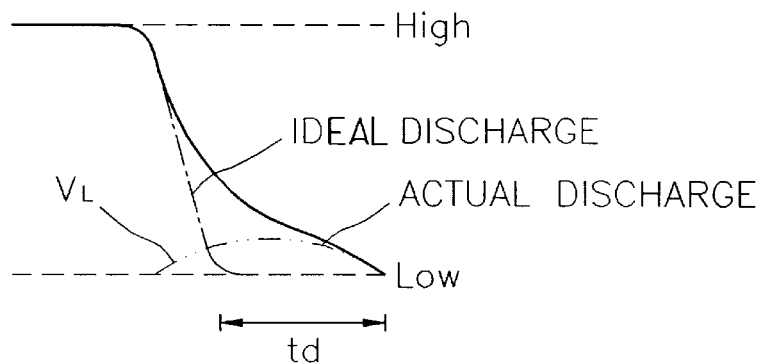
FIG. 3 depicts a diagram showing an output voltage state effected by the parasitic inductance shown in the circuit of FIG. 2.
Figure 4:
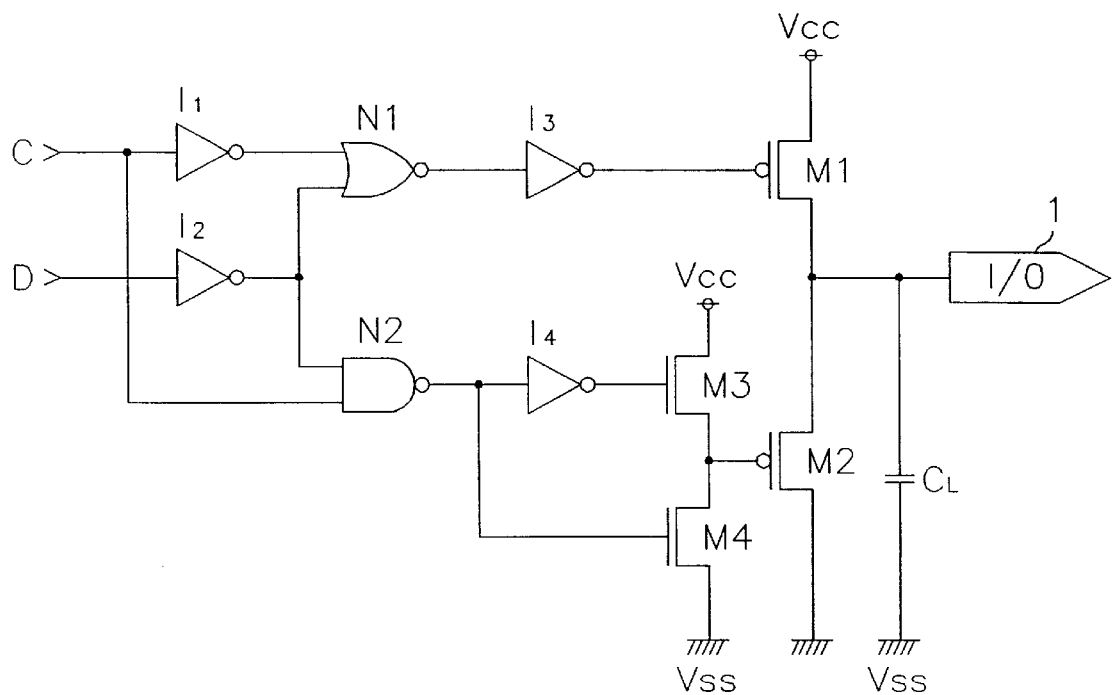
FIG. 4 illustrates a circuit diagram of an another conventional CMOS output driver.
Figure 5:
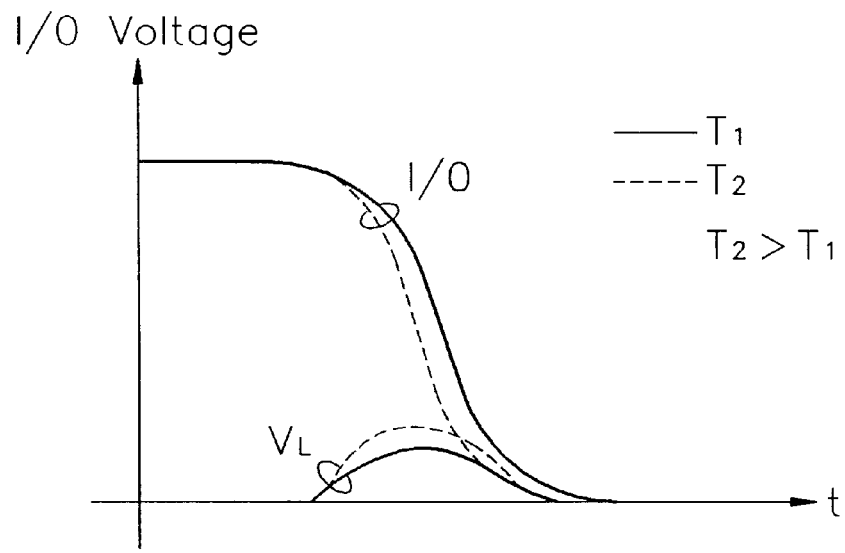
FIG. 5 provides a diagram presenting the output voltage change of the output driver depending on a temperature change.
Figure 7:
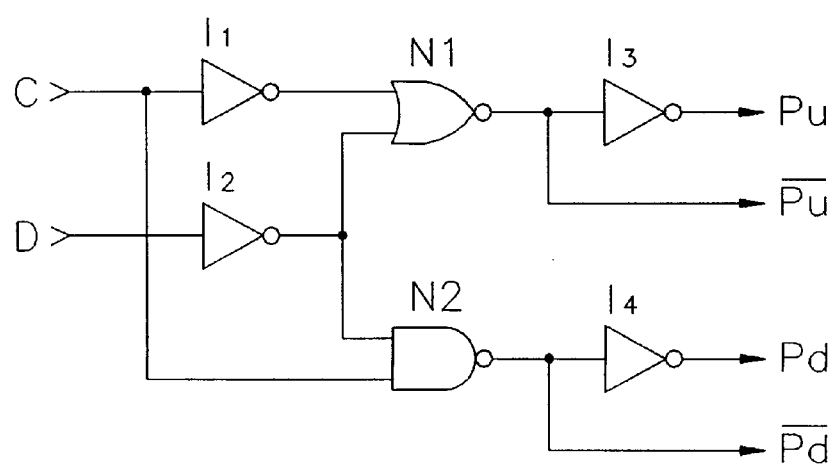
FIG. 7 depicts a circuit diagram of the control circuit contained in the CMOS output driver in accordance with the present invention.

Referring to FIG. 7, the tri-state control circuit 3 shown in FIG. 6 has a substantially same configuration as the circuit shown in FIG. 1, except for producing the first and the fourth control signals. That is, the tri-state control circuit 3 combines a control signal C and a data signal D to output the control signals $\overline{Pu}$, Pu, Pd and $\overline{Pd}$, wherein the signals Pu and Pd are obtained from input terminals of inverters I3 and I4, respectively.

Figure 8:
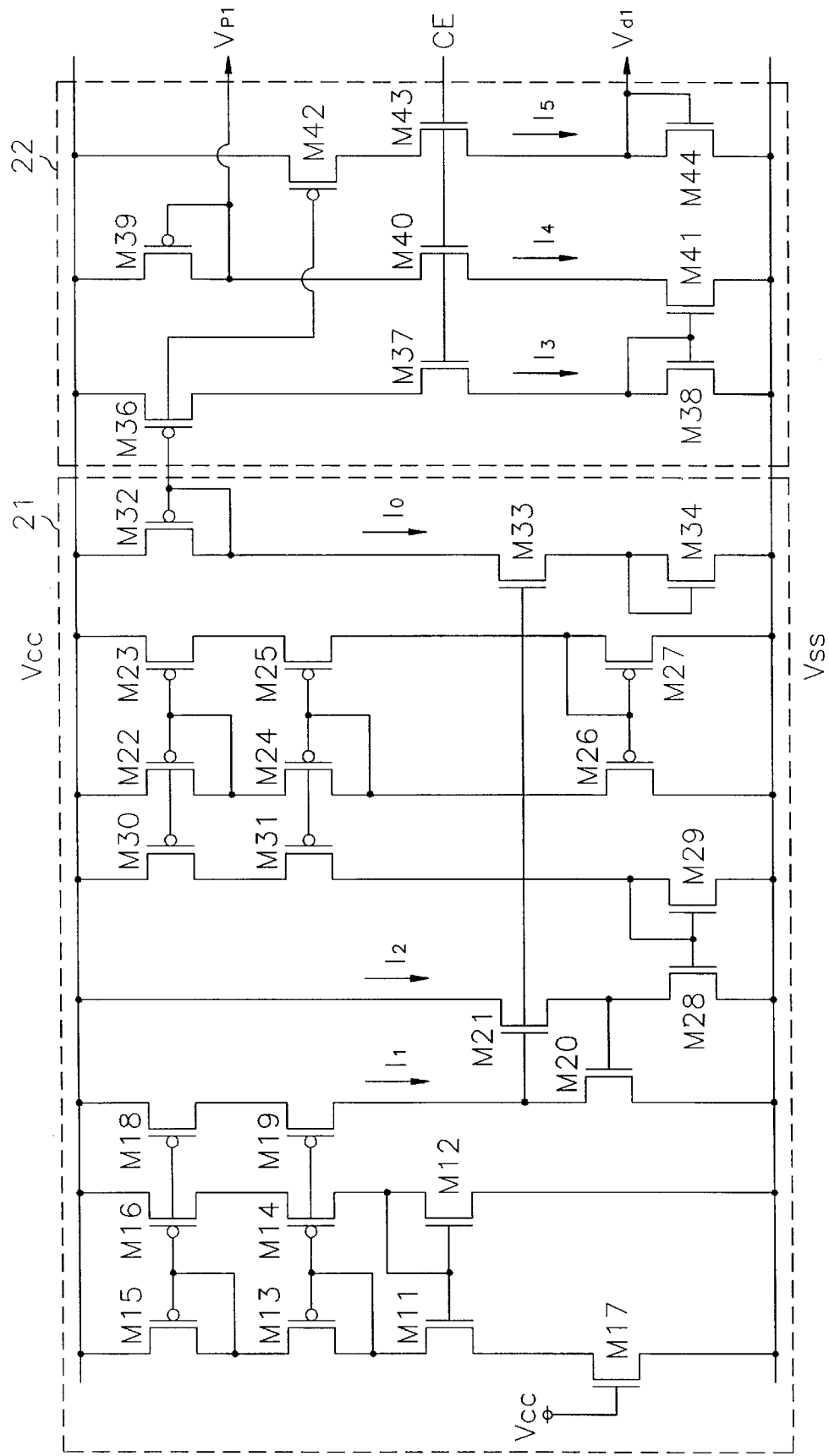
FIG. 8 shows a circuit diagram of a temperature compensating constant-current source contained in the CMOS output drive in accordance with the present invention.

Referring now to FIG. 8, the temperature compensating constant-current source 2 shown in FIG. 6 in accordance with the present invention is illustrated.

The temperature compensating constant-current source 2 includes a temperature compensated constant-current generator 21 and a drive circuit 22. The temperature compensated constant-current generator 21 has transistors M11 to M34 and the drive circuit 22 includes transistors M36 to M44. The temperature compensated constant-current generator 21 is identical to a circuit disclosed in a commonly owned copending application, U.S. Ser. No. 08/89/154, entitled "Temperature Insensitive Constant Current Generator" filed on the same date of the present application; and, therefore, for the sake of convenience, the detailed descriptions thereof is omitted here.

The temperature compensated constant-current generator 21 is connected to the drive circuit 22. The drive circuit 22 includes two current mirror circuits: one is formed with transistors M36 and M42 together with a transistor M32 of the temperature compensating constant-current generator 21; and the other is constructed with transistors M38 and M41. As a result, a temperature compensated constant-current Io from the temperature compensated constant-current generator 21 is changed in the drive circuit 22 by a desired amount to thereby maintain the temperature compensated constant currents I3, I4 and I5 flowing through the drive circuit 22 at the desired levels. The drain of the transistor M41 is connected to the source of the PMOS transistor M39 through a transistor M40, and, at the PMOS transistor M39, its gate and its source are connected with each other to thereby operate in a saturation region. Also, the source of the PMOS transistor M42 is connected to the drain of the an NMOS transistor M44 through the transistor M43, and, at the transistor M44, its gate and its drain are connected with each other to thereby operate in a saturation region.

Accordingly, the currents I4 and I5 flowing through the transistors M39 and M42, respectively, become constant regardless of the change in temperature. That is, if the operating temperature is increased, the level of the voltage Vp1 is decreased and the voltage drop across the gate and the source of the transistor M39 is increased to maintain current I4 at the constant level. On the other hand, if the operating temperature is increased, the level of the voltage Vd1 is increased and the voltage drop across the gate and the source of the transistor M42 is increased to thereby keep the current I5 constant.

Meantime, transistors M37, M40 and M43, which are constructed between the transistors, M36 and 38, 39 and 41, M42 and 44, respectively, are driven in response to an enable signal CE. Namely, the enable signal CE controls the driving of the transistors M37, M40 and M43 not to consume an electric power when chip is at a stand-by state.

Referring back to FIG. 6, when the control signal C is at a low state, regardless of the data signal D, the signal Pu becomes a high voltage level signal, the signal $\overline{Pu}$ becomes a low voltage level signal, the signal Pd becomes a low voltage level, and the signal $\overline{Pd}$ becomes a high voltage level signal. As a result, the transmission gates TG1 and TG2 will be in a turn-off states and the transistors M3 and M4 will be in turn-on states. Therefore, each of the bias voltages Vcc and Vss is applied to the corresponding gates of the pull-up and the pull-down transistors M1 and M2 through the transistors M3 and M4, respectively. The pull-up and the pull-down transistors M1 and M2 will be in a turn-off state to thereby putting the output of the output driver in a high-impedance state.

Meanwhile, when the control signal C is at a high voltage level and the data signal D is at a low voltage level, the signal Pu becomes a high voltage level signal, the signal $\overline{Pu}$ becomes a low voltage level signal, the signal $\overline{Pd}$ becomes a low voltage level signal and the signal Pd becomes a high voltage level signal. As a result, the transmission gate TG1 changes to a turn-on state and the transmission gate TG2 to a turn-off state. Since the transistor M3 is a turn-on state, the bias voltage Vcc is supplied to the gate of the transistor M1 which is then turned off. On the other hand, the voltage output Vd2 is supplied through the transmission gate TG1 to the gate of the transistor M2 which is then turned on. Consequently, the voltage level of the output of the driver become low.

Also, when the control signal C and the data signal D are at a high voltage level, the signal $\overline{Pu}$ becomes a low voltage level signal; the signal $\overline{Pu}$ becomes a high voltage level signal; the signal Pd becomes a low voltage level signal; and the signal $\overline{Pd}$ becomes a high voltage level signal. As a result, the transmission gate TG1 changes to a turn-off state; the transmission gate TG2 to a turn-on state; the transistor M3 to a turn-off state; and the transistor M4 to turn-on state. Accordingly, a first temperature variable voltage Vp2 is applied to the gate of the pull-up transistor M1 through the transmission gate TG2, and then the pull-up transistor M1 changes to a turn on state. On the other hand, the gate voltage of the pull-down transistor M2 is bypassed through the transistor M4 and, therefore, the pull-down transistor M2 changes to a turn-off state. Consequently, the output of the output driver becomes a high voltage level.

In such operation, when the operation temperature is increased, the level of the voltage Vp2 decreases in order to prevent the pull-up current from being decreased and the level of the voltage Vd2 increases in order to prevent the pull-down current from being decreased, by the temperature compensating constant-current source 2, in case of a temperature increase.

That is, in accordance with the present invention, the constant bias voltage and the temperature variable voltage are selectively supplied to the gates of the pull-up and the pull-down transistors to thereby effectively eliminating the ground bounce noise which may be caused by the change of temperature.

Although the invention has been shown and described with respect to the preferred embodiments, it will be understood by those skilled in the art that various changes and modifications may be made without departing from the spirit and scope of the invention as defined in the following claims.

What is claimed is:

1. A circuit for selectively generating one of three voltage level as an output, having a pull-up transistor and a pull-down transistor, said circuit comprising:

a bias voltage source for generating a constant voltage signal;

a temperature compensating constant-current source for outputting variable voltage signal depending on a temperature change;

a tri-state controller for receiving a data signal to generate a control signal based on the data signal; and switch means, in response to the control signal, for selectively providing the bias voltage source and the temperature compensating constant-current source to the pull-up and the pull-down transistors.

2. The circuit as recited in claim 1, wherein the switch means includes:

a transmission gate for applying the variable voltage to a gate of the pull-up transistor in response to the control signal;

a transistor for supplying constant voltage signal to the gate of the pull-up transistor in response to the control signal;

a transmission gate for applying the variable voltage to a gate of the pull-down transistor in response to the control signal; and a transistor for supplying the constant voltage signal to a gate of the pull-down transistor in response to the control signal.

3. The circuit as recited in claim 2, further comprising operational amplifiers for buffering the variable voltage signal which is transmitted to the transmission gates.

4. The circuit as recited in claim 3, wherein said temperature compensating constant-current source includes:

a temperature compensating constant-current generator for outputting a temperature compensated current signal; and a drive circuit for outputting the variable voltage signal corresponding to the temperature change based on the temperature compensated current.

* * * * *